(12) United States Patent
Yoshida et al.

(10) Patent No.: US 7,998,556 B2
(45) Date of Patent: Aug. 16, 2011

(54) ELEMENT STRUCTURE AND METHOD FOR PRODUCING THE SAME

(75) Inventors: Kazuhiro Yoshida, Omihachiman (JP); Shikou Miyazaki, Tonami (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 12/493,380

(22) Filed: Jun. 29, 2009

(65) Prior Publication Data

US 2009/0297770 A1 Dec. 3, 2009

Related U.S. Application Data

(63) Continuation of application No. PCT/JP2008/064026, filed on Aug. 5, 2008.

(30) Foreign Application Priority Data

Aug. 10, 2007 (JP) .................................. 2007-208873

(51) Int. Cl.
  *B32B 3/00* (2006.01)
  *B32B 27/00* (2006.01)
  *B32B 27/06* (2006.01)
  *G01P 15/08* (2006.01)

(52) U.S. Cl. ..................... 428/166; 428/473.5; 428/435; 257/417

(58) Field of Classification Search .................. 428/166, 428/473.5, 435, 131; 257/417; 73/514.33, 73/514.34

See application file for complete search history.

(56) References Cited

U.S. PATENT DOCUMENTS

| 6,255,741 B1 | 7/2001 | Yoshihara et al. |
| 2006/0097331 A1 | 5/2006 | Hattori et al. |

FOREIGN PATENT DOCUMENTS

| JP | 06-082474 A | | 3/1994 |
| JP | 06-132414 A | | 5/1994 |
| JP | 08-317670 A | | 11/1996 |
| JP | 08317670 A | * | 11/1996 |
| JP | 10-019924 A | | 1/1998 |
| JP | 2000-031349 A | | 1/2000 |
| JP | 2002-231920 A | | 8/2002 |
| JP | 2002231920 A | * | 8/2002 |
| JP | 2005-158975 A | | 6/2005 |
| JP | 2006-179679 A | | 7/2006 |
| JP | 2006-189418 A | | 7/2006 |

OTHER PUBLICATIONS

Baise, A.I. "Optimizing Polyimide Cure Using Infrared Spectroscopy and a Factorial Design" in: Journal of Applied Polymer Science (1986), vol. 32, pp. 4043-4048.*

Official Communication issued in International Patent Application No. PCT/JP2008/064026, mailed on Sep. 22, 2008.

* cited by examiner

*Primary Examiner* — David R Sample
*Assistant Examiner* — Catherine Simone
(74) *Attorney, Agent, or Firm* — Dickstein Shapiro LLP (57) ABSTRACT

An element structure has a polyimide resin applied on a surface of a first substrate to a uniform thickness, and is subsequently heated to form a semi-cured polyimide layer. The polyimide layer is then cured to form a cured first polyimide layer. A polyimide resin is applied on a surface of a second substrate to a uniform thickness, and is subsequently heated to form a semi-cured polyimide layer. The polyimide layer is then cured to form a cured second polyimide layer. The cured first and second polyimide layers are pressed on each other and heated to a bonding temperature, thereby joining the polyimide layers together. Thus, the first substrate and the second substrate are combined with the polyimide layer being the bonded structure of the polyimide layers therebetween.

4 Claims, 5 Drawing Sheets

ELEMENT STRUCTURE AND METHOD FOR PRODUCING THE SAME

BACKGROUND OF THE INVENTION

1. Field of the Invention

The present invention relates to an element structure having a space therewithin and a method for producing the same.

2. Description of the Related Art

Figure 5A:
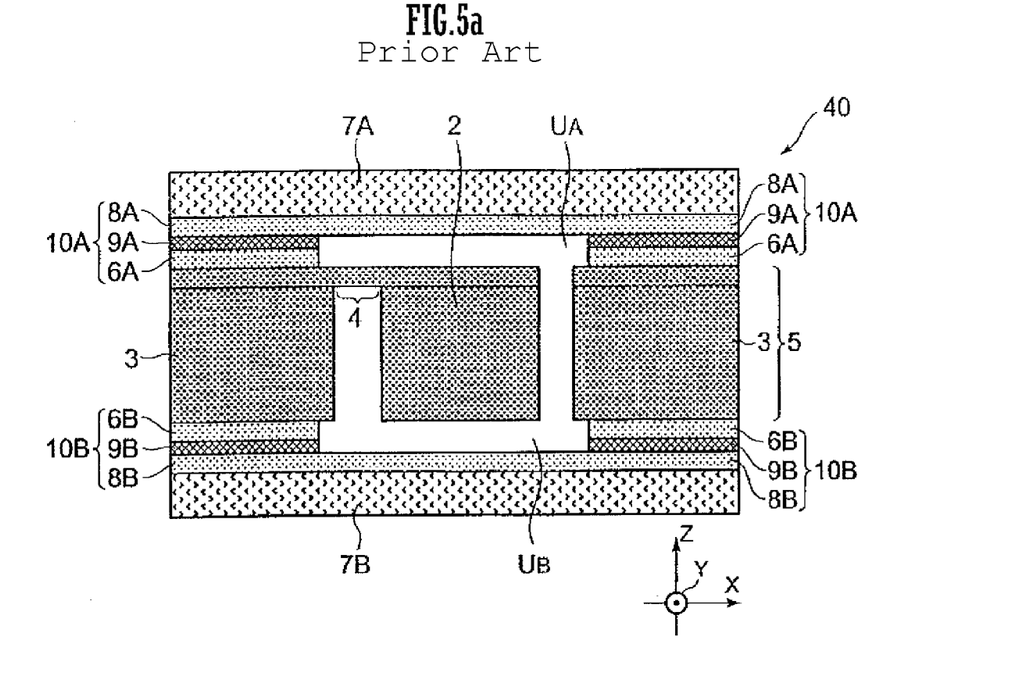
FIG. 5a is a sectional view of a known element structure.
Figure 5B:
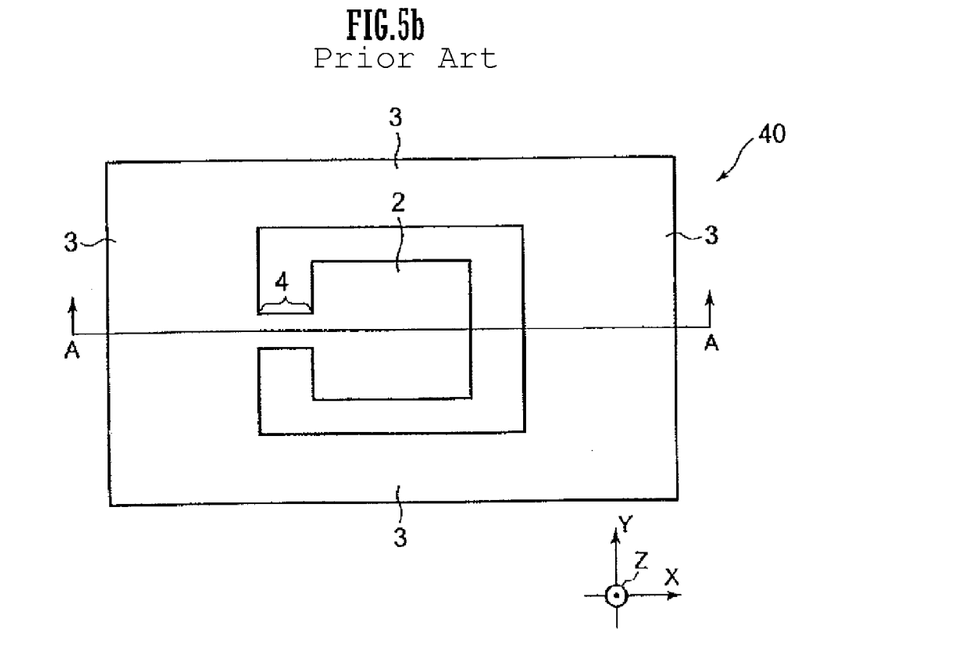

FIG. 5a shows a schematic sectional view of an acceleration sensor 40. The acceleration sensor 40 is a type of element structure having a space therewithin. FIG. 5b shows a schematic top view of an SOI (silicon-on-insulator) substrate 5 of the acceleration sensor 40. FIG. 5a is a fragmentary sectional view of the acceleration sensor 40 taken along line A-A in FIG. 5b.

The acceleration sensor 40 includes a floating weight 2. A securing member 3 is disposed around the weight 2 with a space therebetween. The weight 2 is held and secured to the securing member 3 with a beam 4. The beam 4 has a piezoelectric resistor (not shown) whose electrical resistance varies according to the changes in stress. The beam 4 and the securing member 3 are provided with a wiring pattern (not shown) on the surface thereof. The wiring pattern is electrically connected to the piezoelectric resistor.

The weight 2, the securing member 3, and the beam 4 are integrated by etching a common SOI substrate 5. The SOI substrate 5 includes the following elements (not shown): a silicon support layer, a silicon oxide insulating layer and a silicon SOI layer in that order from below. A polyimide layer 6A is formed on the front surface of the SOI substrate 5. Also, a polyimide layer 6B is formed on the rear surface of the SOI substrate 5. These polyimide layers 6A and 6B have holes $U_A$ and $U_B$, respectively, located in the regions opposing the weight 2 and the beam 4. A glass substrate 7A having a polyimide layer 8A is disposed over the polyimide layer 6A. The polyimide layer 6A is bonded to the polyimide layer 8A with an adhesive 9A. Also, a glass substrate 7B having a polyimide layer 8B is disposed under the polyimide layer 6B. The polyimide layer 6B is bonded to the polyimide layer 8B with an adhesive 9B. By bonding the polyimide layer 6A to the polyimide layer 8A with an adhesive, and by bonding the polyimide layer 6B to the polyimide 8B with an adhesive, the SOI substrate 5 and the glass substrates 7A and 7B are combined.

The bonded structure 10A of the polyimide layers 6A and 8A with the adhesive 9A has a recess defined by the hole $U_A$ of the polyimide layer 6A. The bonded structure 10B of the polyimide layers 6B and 8B with the adhesive 9B has a recess defined by the hole $U_B$ of the polyimide layer 6B. These recesses define a space between the polyimide layer 8A and the weight 2 and beam 4, and a space between the polyimide layer 8B and the weight 2. The weight 2 and the beam 4 are enclosed for movement in the Z direction shown in FIGS. 5a and 5b within the bonded composite of the SOI substrate 5 and the glass substrates 7A and 7B. The weight 2 and the beam 4 are protected from the external environment by an enclosure. The polyimide layers 8A and 8B limit the movement of the weight 2 and, consequently, prevent abnormal plastic deformation and breakage resulting from excessive movement of the weight 2.

In the acceleration sensor 40, when an acceleration in the Z direction arises, the beam 4 is deformed to move the weight 2 in the Z direction. The movement of the weight 2 and the deformation of the beam 4 in the Z direction are increased as the acceleration in the Z direction is increased, and thus depend on the magnitude of the acceleration in the Z direction. The deformation of the beam 4 can be measured by detecting a signal according to the electrical resistance of the piezoelectric resistor provided at the beam 4, and the magnitude of the acceleration in the Z direction can be determined from the deformation of the beam 4.

In the above acceleration sensor 40, the polyimide layers 6A and 8A are bonded with the adhesive 9A, and the polyimide layers 6B and 8B are bonded with the adhesive 9B. It is however very difficult to apply a desired amount of adhesive (9A and 9B) to the polyimide layers 6A and 6B (8A and 8B). In addition, the pressure placed on the polyimide layers 6A, 8A, 6B, and 8B is varied in the step of bonding the polyimide layers 6A and 8A or the polyimide layers 6B and 8B with an adhesive 9A or 9B. Consequently, the thicknesses of the adhesives 9A and 9B are varied. If the adhesives 9A and 9B have small thicknesses, the distances between the weight 2 and the polyimide layers 8A and 8B is reduced; and if the adhesives 9A and 9B have large thicknesses, the distances between the weight 2 and the polyimide layers 8A and 8B are increased. Hence, the variations in thicknesses of the adhesives 9A and 9B undesirably varies the distances between the weight 2 and the polyimide layers 8A and 8B. The distances between the weight 2 and the polyimide layers 8A and 8B regulate the movement of the weight 2 and are involved in the performance of acceleration detection and the durability. Accordingly, variations in distance between the weight 2 and the polyimide layers 8A and 8B negatively affect the performance of acceleration detection and the durability.

In addition, if the amount of the adhesives 9A and 9B applied to the polyimide layers 6A and 6B (8A and 8B) in a manufacturing process of the acceleration sensor 40 is small, the adhesions between the polyimide layers 6A and 8A and between the polyimide layers 6B and 8B are undesirably reduced. In contrast, if the amount of the adhesives 9A and 9B is excessively large, the excess of the adhesives 9A and 9B undesirably spreads to the space around the weight 2 from the boundaries between the polyimide layers 6A and 8A and between the polyimide layers 6B and 8B. Furthermore, since the adhesives 9A and 9B contain an organic solvent, voids are formed in the cured adhesives 9A and 9B by volatilizing the solvent. The voids reduce the adhesion between the polyimide layers 6A and 8A and between the polyimide layers 6B and 8B. Also, the amount of voids and the shape of the voids vary the thicknesses of the adhesives 9A and 9B and accordingly vary the distances between the weight 2 and the polyimide layers 8A and 8B.

SUMMARY OF THE INVENTION

To solve the above-described problems, the present invention provides the following element structure. An element structure according to a preferred embodiment of the present invention includes a first substrate and a first polyimide layer disposed on a surface of the first substrate. The first polyimide layer is cured and has a uniform thickness. The element structure also includes a second substrate and a second polyimide layer disposed on a surface of the second substrate. The second polyimide layer is cured and has a uniform thickness. At least one of the first and second polyimide layers has a hole passing through the thickness thereof. The first and second polyimide layers are joined together by being pressed on each other and being heated to a bonding temperature, thereby joining the first and second substrates together with the first and second polyimide layers therebetween. The bonded structure of the first and second substrates has a space defined by the hole therewithin, and a substantially constant distance between the first substrate and the second substrate over the entire region where the first and second substrates oppose each other.

An element structure according to another preferred embodiment of the present invention includes an operational portion substrate having an operational portion in a region other than the outer region of the substrate and a polyimide layer disposed on a surface of the operational portion substrate. The polyimide layer has a recess in a region opposing the operational portion. The recess defines a space between the operational portion and the polyimide layer. The element structure also includes a cover substrate joined to the operational portion substrate with the polyimide layer therebetween. The recess has an internal side wall rising perpendicular or substantially perpendicular to the surface of the operational portion substrate and an internal smooth flat bottom surface opposing the surface of the operational portion substrate with a constant distance therebetween.

In a method for manufacturing an element structure according to yet another preferred embodiment of the present invention, a cured polyimide layer is formed by patterning a polyimide resin on a surface of an operational portion substrate having an operational portion in a region other than the outer region thereof, in a region of the operational portion substrate surrounding the operational portion, and subsequently by curing the polyimide resin. A polyimide layer is formed on a surface of a cover substrate by applying a polyimide resin over the entire surface of the cover substrate or patterning the polyimide resin on the surface of the cover substrate, and subsequently by curing the polyimide resin. Then, the operational portion substrate is opposed to the cover substrate with the cured polyimide layer on the operational portion substrate and the cured polyimide layer on the cover substrate therebetween. The polyimide layer on the operational portion substrate and the polyimide layer on the cover substrate are pressed on each other and heated to a bonding temperature to join the polyimide layers together, thereby combining the operational portion substrate and the cover substrate.

In a structure according to a preferred embodiment of the present invention as described below and having a polyimide layer having a recess in a region opposing an operational portion, the recess can be formed as designed for the following reasons. In the structure according to a preferred embodiment of the present invention having such a recess, the operational portion substrate and the cover substrate are combined with a polyimide layer therebetween, and the polyimide layer has a recess in a region opposing the operational portion of the operational portion substrate. The recess has an internal side wall rising perpendicular or substantially perpendicular to the surface of the operational portion substrate and a smooth flat internal bottom surface opposing the operational portion substrate with a constant distance therebetween. In order to form such a rising internal side wall in the recess and a smooth flat internal bottom surface opposing the surface of the operational portion substrate with a constant distance therebetween, a highly precise manufacturing technique is required. Thus, the recess formed by such a manufacturing technique has dimensions as designed.

More specifically, for example, the polyimide layer includes an operational portion substrate side polyimide layer formed in a cured state on the surface of a portion of the operational portion substrate surrounding the operational portion and a cover substrate side polyimide layer disposed in a cured state over the entire surface of the operational portion substrate side surface of the cover substrate, and these polyimide layers are joined together. The operational portion substrate side polyimide layer and the cover substrate side polyimide layer can be formed substantially as designed because of the high precision of coating technique of a polyimide resin on the operational portion substrate or the cover substrate, or the high precision of, for example, photolithography for forming a hole in the polyimide layer.

In addition, the operational portion substrate side polyimide layer and the cover substrate side polyimide layer are joined by the following technique without using an adhesive, thus preventing the negative effects produced by the use of adhesive. The cured operational portion substrate side polyimide layer and the cured cover substrate side polyimide layer are joined together by thermocompression bonding performed by pressing the polyimide layers on each other and heating to a bonding temperature. Since the bonding technique can prevent negative effects resulting from the use of adhesive, the operational portion of the operational portion substrate and the internal bottom surface in the recess can have a distance as designed with high precision.

If the operational portion substrate side polyimide layer and the cover substrate side polyimide layer are joined together with an adhesive, the following problem occurs. If the amount of the adhesive is excessively large, the excess of the adhesive spreads to the space in the recess of the polyimide layer and causes problems in the operational portion. If, in contrast, the amount of adhesive is small, the adhesion between the operational portion substrate side polyimide layer and the cover substrate side polyimide layer (or adhesion between the operational portion substrate and the cover substrate) is disadvantageously reduced. By thermocompression bonding of the operational portion substrate side polyimide layer and the cover substrate side polyimide layer, problems resulting from the use of adhesive can be avoided. In addition, the step of applying an adhesive can be reduced to simplify the manufacturing process of an element. Furthermore, the problem can be prevented that the adhesion is reduced by voids formed by removing the organic solvent. Also, the problem can be prevented that the distance between the operational portion of the operational portion substrate and the internal bottom surface of the recess is varied depending on the amount of voids and the shape of the voids.

By joining the cured operational portion substrate side polyimide layer and the cured cover substrate side polyimide layer together by thermocompression bonding, the bonding strength can be enhanced, and the variation in boding strength can be reduced. Thus, the element has improved reliability and durability. In addition, the recess can be formed in the polyimide layer substantially as designed. Accordingly, the variation of performance of the operational portion, which is associated with the dimensions of the recess, can be reduced. Thus, the element can enhance the reliability of performance.

The operational portion substrate and the cover substrate may be directly joined by, for example, anodic bonding. In this instance, however, if an electroconductive wiring pattern is formed on a surface of the operational portion substrate to be joined with the cover substrate, the region where the wiring pattern is formed and its vicinity cannot be joined with the cover substrate by anodic bonding. Consequently, the strength of anodic bonding between the operational portion substrate and the cover substrate is disadvantageously reduced. The thickness of the wiring pattern can disadvantageously vary the distance between the operational portion of the operational portion substrate and the cover substrate. In a preferred embodiment of the present invention, by combining the operational portion substrate and the cover substrate with a polyimide layer therebetween, the polyimide layer joins the operational portion substrate and the cover substrate together tightly without gaps even if a wiring pattern is provided.

Consequently, the above-described problems can be prevented, and the structure according to a preferred embodiment of the present invention can produce the above-described advantageous effects.

In another preferred embodiment, the first and second substrates are combined with each other with the first and second polyimide layers therebetween. The first and second polyimide layers are pressed on each other in cured states and are heated to a bonding temperature, thus thermocompression-bonded. Thus, thermocompression bonding of the first and second polyimide layers allows the distance between the first substrate and the second substrate to be substantially constant over the entire region where the first and second substrates oppose each other. The variation in performance of the element involved with the distance thus can be reduced, and the element can enhance the reliability of performance. Also, since the bonding strength between the first and second polyimide layers can be enhanced, the element has improved reliability and durability.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 2a is a representation of a step of a manufacturing process of the acceleration sensor shown in FIG. 1a.

FIG. 2b is a representation of a step of a manufacturing process of the acceleration sensor shown in FIG. 1a.

FIG. 2c is a representation of a step of a manufacturing process of the acceleration sensor shown in FIG. 1a.

FIG. 2d is a representation of a step of a manufacturing process of the acceleration sensor shown in FIG. 1a.

FIG. 5b is a schematic top view of an SOI substrate of the acceleration sensor shown in FIG. 5a.

DETAILED DESCRIPTION OF THE PREFERRED EMBODIMENTS

Preferred embodiments of the present invention will now be described with reference to the drawings.

Figure 1A:
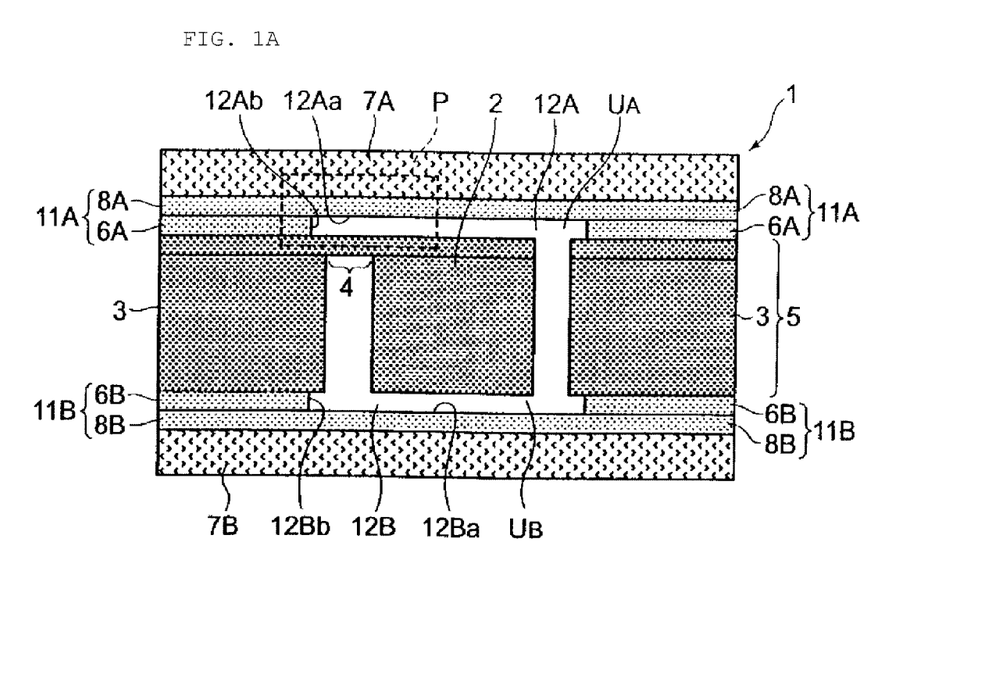
FIG. 1a is a representation of an acceleration sensor having an element structure according to a first preferred embodiment of the present invention.
Figure 1B:
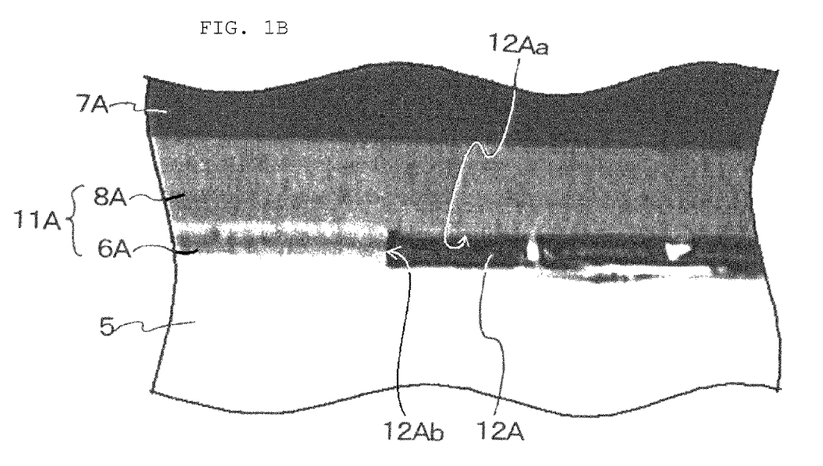
FIG. 1b is a sectional photograph of region P in FIG. 1a according to a preferred embodiment of the present invention.

FIG. 1a shows a schematic sectional view of a first preferred embodiment having an element structure of the present invention. The first preferred embodiment preferably is an acceleration sensor. FIG. 1b shows a sectional photograph of region P shown in FIG. 1a according to a preferred embodiment of the present invention. The same parts in the first preferred embodiment of the present invention as in the acceleration sensor 40 shown in FIG. 5a are designated by the same numerals, and the descriptions of the same parts are not repeated.

In the acceleration sensor 1 according to the first preferred embodiment, an operational portion including a movable weight 2 and a beam 4 is formed in an SOI substrate (operational portion substrate (first substrate)) 5. A polyimide layer (operational portion substrate side polyimide layer (first polyimide layer)) 6A is formed in a cured state with a substantially uniform thickness on the front surface of the SOI substrate 5. Another polyimide layer (cover substrate side polyimide layer (second polyimide layer)) 8A also formed in a cured state with a substantially uniform thickness on the SOI substrate 5 side surface of a glass substrate (cover substrate (second substrate)) 7A. These polyimide layers 6A and 8A in cured state are joined together by thermocompression bonding. A polyimide layer 11A is thus formed and, consequently, the SOI substrate 5 and the glass substrate 7A are combined together. In the same manner, a cured polyimide layer 6B having a uniform thickness is formed on the rear surface of the SOI substrate 5. Another cured polyimide layer (cover substrate side polyimide layer (third polyimide layer)) 8B also formed with a uniform thickness on a glass substrate (cover substrate (third substrate)) 7B. These polyimide layers 6B and 8B in cured state are joined together by thermocompression bonding. A polyimide layer 11B is thus formed and, consequently, the SOI substrate 5 and the glass substrate 7B are combined together. The polyimide layers 6A, 6B, 8A, and 8B are made of the same polyimide resin. The polyimide resin may be a thermosetting resin or a thermoplastic resin.

The polyimide layers 11A and 11B, each being a thermocompression-bonded structure of the cured polyimide layers 6A and 8A or the polyimide layers 6B and 8B, have uniform thicknesses, respectively. Consequently, the distance between the SOI substrate 5 and the glass substrate 7A is substantially constant over the entire region where the SOI substrate 5 and the glass substrate 7A oppose each other. The distance between the SOI substrate 5 and the glass substrate 7B is also substantially constant over the entire region where the SOI substrate 5 and the glass substrate 7B oppose each other.

The polyimide layers 11A and 11B have recesses 12A and 12B respectively located in the region opposing the weight 2 and the beam 4. The recesses 12A and 12B are defined by holes $U_A$ and $U_B$ formed in the polyimide layers 6A and 6B, respectively. As shown in the sectional photograph in FIG. 1b, the recesses 12A and 12B have internal smooth flat bottom surfaces 12Aa and 12Ba, respectively, opposing the respective surfaces of the SOI substrate 5 with constant distances. The recesses 12A and 12B also have internal side walls 12Ab and 12Bb, respectively, rising perpendicularly or substantially perpendicularly to the surfaces of the SOI substrate 5.

Figure 2A:
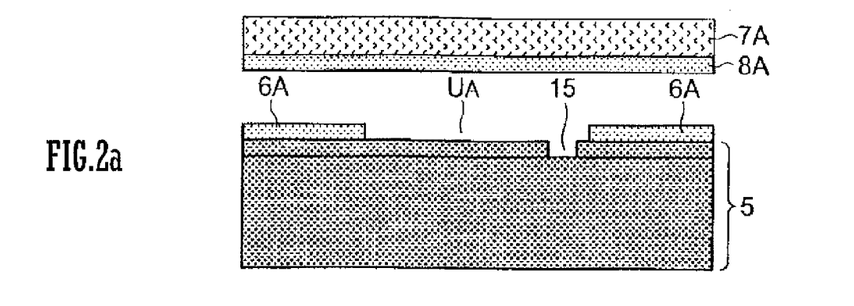

A manufacturing process of the acceleration sensor according to the first preferred embodiment will now be described. First, a piezoelectric resistor is formed on the surface of the SOI substrate 5, and a wiring pattern electrically connected to the piezoelectric resistor is formed. The wiring pattern on the surface of the SOI substrate 5 may be formed, for example, by patterning an electroconductive material on the SOI substrate 5, or by partially reducing the resistance of the surface of the SOI substrate 5. According to a predetermined design of the wiring pattern, a single wiring pattern selected from some types may be formed on the SOI substrate 5, or a plurality of types of wiring patterns may be formed in combination on the SOI substrate 5.

Then, a polyimide resin is applied to a uniform thickness over the entire surface of the SOI substrate 5. The previously designed thickness of the polyimide resin refers to a height of a previously designed space between the weight 2 and the polyimide layer 8A (that is, a previously designed maximum range of the movement of the weight 2). The designed thickness is preferably in the range of, for example, about 3 μm to about 20 μm. In order to apply a polyimide resin to a uniform thickness over the entire surface, spin coating may be employed.

After applying the polyimide resin, the polyimide resin is heated to form a semi-cured polyimide layer. Subsequently, a hole $U_A$ is formed in the semi-cured polyimide layer by photolithography. Then, the polyimide layer is heated to cure. In this curing step, the polyimide layer is heated in a nitrogen atmosphere in, for example, an inert oven. The heating temperature is of course such that the imidation of the polyimide layer proceeds at a rate suitable for the manufacture. The heating temperature is also such that the solvent in the polyimide layer can sufficiently be removed by heating, and such that the wiring pattern on the surface of the SOI substrate 5 is not damaged by heating. Such heating temperature is, for example, in the range of about 250° C. to about 450° C. The cured polyimide layer 6A having a uniform thickness is thus formed on the SOI substrate 5. The polyimide layer 6A may be formed by patterning using screen printing. The cured polyimide layer, if made of a thermosetting resin, is in a state of spatial network polymer (complicated three-dimensional network with covalent bonds) formed by chemical reaction of a soluble or fusible material having a relatively low molecular weight by heating or using a catalyst. The cured polyimide layer, if made of a thermoplastic resin, is in a state in which molecules are intertwined with each other to form a chain.

Then, a groove 15 for forming the weight 2, the securing member 3, and the beam 4 is formed in the SOI layer of the SOI substrate 5 exposed in the hole $U_A$ of the polyimide layer 6A by photolithography, as shown in the schematic sectional view in FIG. 2a. A process of the photolithography will now be described in detail. First, a photoresist layer is formed over the entire surface of the SOI substrate 5 having the polyimide layer 6A. A mask having a patterned opening for forming the weight 2, the securing member 3, and the beam 4 is formed in the upper surface of the photoresist layer. The portions of the photoresist layer in the regions where the weight 2, the securing member 3, and the beam 4 are to be formed are cured by being irradiated with light through the mask. The uncured portion of the photoresist layer is removed to form a through-hole. Thus, the surface of the SOI substrate 5 is partially exposed. Subsequently, the SOI layer of the SOI substrate 5 is removed from the through-hole of the photoresist layer by dry etching or wet etching. The groove 15 is thus formed. Then, the photoresist layer is removed by, for example, washing. The groove 15 can be formed in the SOI layer of the SOI substrate 5 by photolithography.

Figure 2B:
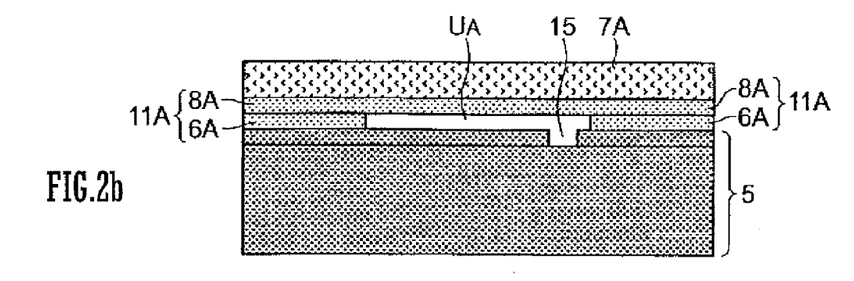

In another step, a polyimide resin is applied over the entire surface of the glass substrate 7A. The polyimide resin is uniformly applied over the entire surface of the glass substrate 7A so as to have a previously designed thickness by, for example, spin coating, as in the step of applying the polyimide resin onto the SOI substrate 5. Then, the polyimide resin is heated to form a semi-cured polyimide layer. This semi-cured polyimide layer is heated to cure in a nitrogen atmosphere in, for example, an inert oven, in the same manner as in the step of curing the foregoing polyimide layer. The cured polyimide layer 8A having a uniform thickness is thus formed on the glass substrate 7A.

The, the SOI substrate 5 and the glass substrate 7A are opposed to each other such that the cured polyimide layers 6A and 8A come into contact with each other, as shown in FIG. 2b. The polyimide layers 6A and 8A are pressed on each other and heated to a predetermined bonding temperature, thus thermocompression-bonded to each other. The pressure applied to the polyimide layers 6A and 8A for thermocompression bonding is optimally set depending on the type of the polyimide resin forming the polyimide layers 6A and 8A. The heating temperature (bonding temperature) of the polyimide layers 6A and 8A for thermocompression bonding is higher than the glass transition temperature of the polyimide resin forming the polyimide layers 6A and 8A, and at which the polyimide layers 6A and 8A are not fused or the amount of the polyimide resin is not reduced. Preferably, the heating temperature (bonding temperature) of the polyimide layers 6A and 8A for thermocompression bonding preferably is about 50° C. to about 150° C. higher than the glass transition temperature. In order to prevent the polyimide layers 6A and 8A from being fused or prevent the amount of the polyimide resin from being reduced, the temperature is set as below. If the polyimide layers 6A and 8A are formed of a thermosetting polyimide resin, the temperature is lower than the thermal decomposition temperature of the thermosetting polyimide resin. If the polyimide layers 6A and 8A are formed of a thermoplastic polyimide resin, the temperature is lower than the melting point of the thermoplastic polyimide resin. In addition, since the SOI substrate 5 is also heated in the thermocompression bonding step, it should be considered that the wiring pattern formed on the SOI substrate 5 may be damaged by heat. Accordingly, the upper limit of the heating temperature preferably is about 450° C. For the polyimide layers 6A and 8A, therefore, a polyimide resin is selected which has a glass transition temperature (for example, in the range of about 100° C. to about 400° C.) allowing thermocompression bonding at a heating temperature at which the wiring pattern is not damaged.

The sectional photograph in FIG. 1b shows a state of polyimide layers 6A and 8A having a glass transition temperature of about 230° C. after thermocompression bonding performed by compression at a pressure of about 1.5 MPa and heating at a bonding temperature of about 300° C. As is clear from the sectional photograph, the formation of the polyimide layer 11A by thermocompression bonding of the polyimide layers 6A and 8A produces the following effect. The recess 12A in the polyimide layer 11A has an internal smooth flat bottom surface 12Aa opposing the SOI substrate 5 with a constant distance, and a rising internal side wall 12Ab.

Figure 2C:
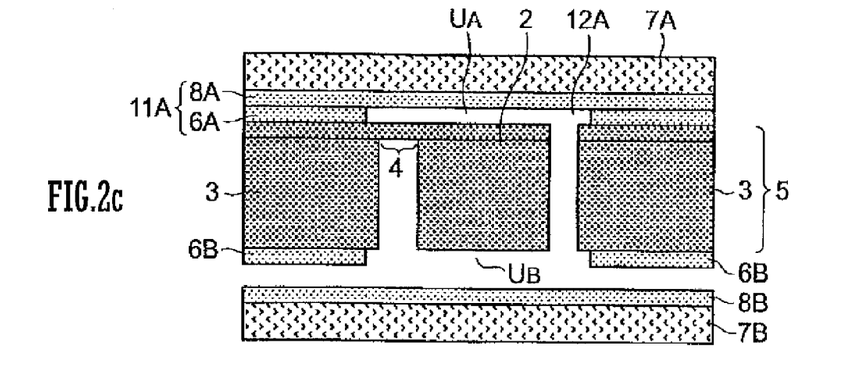

After thermocompression bonding of the polyimide layers 6A and 8A, a polyimide resin is applied over the entire surface of the rear surface of the SOI substrate 5. This application is performed so as to form a uniform thickness by, for example, spin coating in the same manner as in the preceding application of the polyimide resin. Then, the polyimide resin is heated to form a semi-cured polyimide layer. Then, a hole $U_B$ is formed in the polyimide layer by photolithography. Subsequently, the polyimide layer is cured in the same manner as above. The cured polyimide layer 6B having a uniform thickness is thus formed on the rear surface of the SOI substrate 5. The polyimide layer 6A on the front surface of the SOI substrate 5 and the polyimide layer 6B on the rear surface may have the same thickness or different thicknesses.

Figure 2D:
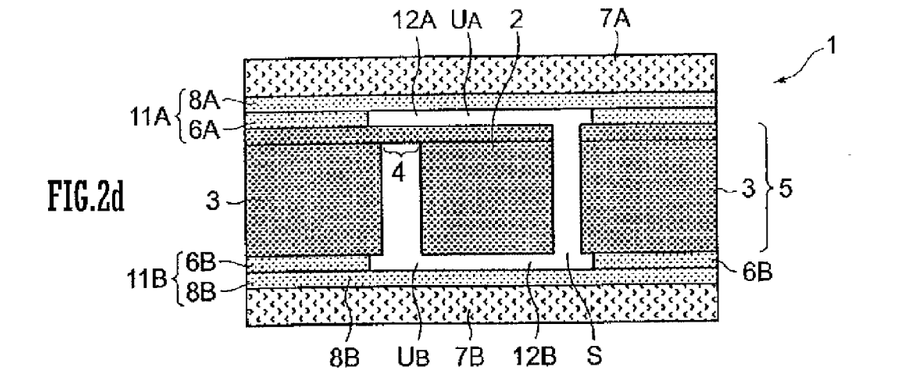

Then, the weight 2, the securing member 3, and the beam 4 are formed in the SOI substrate 5, as shown in FIG. 2c. These portions are formed by etching the support layer and insulating layer of the SOI substrate 5 by photolithography from the rear side of the SOI substrate 5 through the hole $U_B$ in the polyimide layer 6B on the rear side. Subsequently, a glass substrate 7B is disposed on the rear surface of the SOI substrate 5. The glass substrate 7B is previously provided with a cured polyimide layer 8B over the entire surface thereof in the same manner as in the step of forming the polyimide layer 8A on the glass substrate 7A. The polyimide layer 8B of the glass substrate 7B and the polyimide layer 6B on the rear surface of the SOI substrate 5 are brought into contact with each other, as shown in FIG. 2d. These polyimide layers 6B and 8B are also joined together by thermocompression bonding in the same manner as above. Thus, the polyimide layer 11B is formed and the SOI substrate 5 and the glass substrate 7B are combined together. Preferably, for thermocompression bonding, the polyimide layers 6B and 8B are heated at a temperature less than or equal to the heating temperature of the preceding thermocompression bonding so that the polyimide layer 11A formed in the preceding thermocompression bonding is not negatively affected.

The acceleration sensor of the first preferred embodiment is thus produced through the above-described manufacturing process.

Figure 3A:
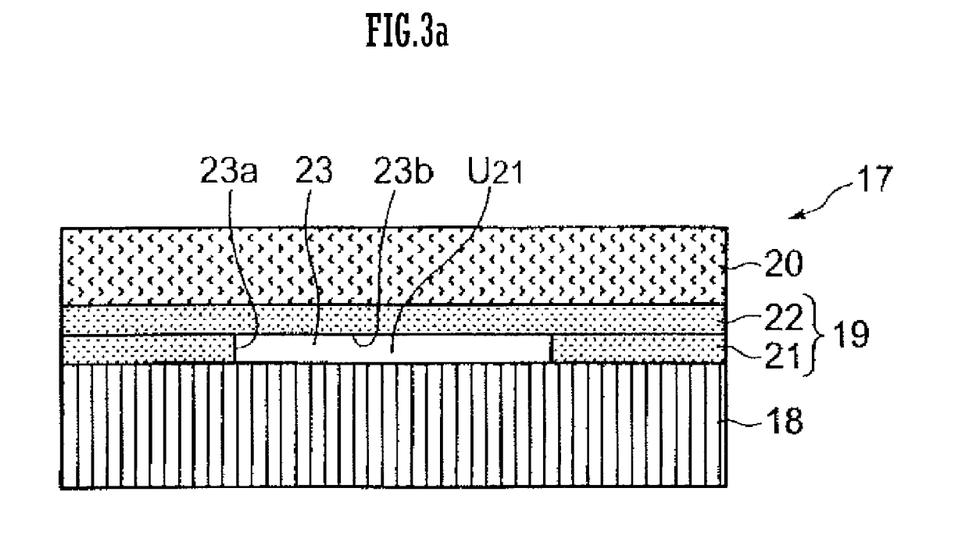
FIG. 3a is a representation of an SAW filter having an element structure according to a second preferred embodiment of the present invention.

A second preferred embodiment will now be described. The element having a structure according the second preferred embodiment of the present invention is an SAW filter (surface acoustic wave filter). FIG. 3a shows a schematic sectional view of the SAW filter 17. The SAW filter 17 of the second preferred embodiment includes a piezoelectric substrate (operational portion substrate (first substrate)) 18. An operational portion of the filter (for example, a comb-like electrode oscillated by surface acoustic waves) (not shown) is located on the surface of the piezoelectric substrate 18 in a region other than the outer region of the substrate (for example, middle region). In addition, a wiring pattern (not shown) electrically connected to the operational portion is located on the surface of the piezoelectric substrate 18. A glass substrate (second substrate) 20 defining a cover substrate is combined with the surface of the piezoelectric substrate 18 with a polyimide layer 19 therebetween.

The polyimide layer 19 is formed by thermocompression bonding of polyimide layers 21 and 22. The polyimide layer 21 is a cured layer having a uniform thickness formed as an operational portion substrate side polyimide layer (first polyimide layer) on the surface of the piezoelectric substrate 18. The polyimide layer 22 is a cured layer having a uniform thickness formed as a cover substrate side polyimide layer (second polyimide layer) on the surface of the glass substrate 20. These polyimide layers 21 and 22 are joined together to form a polyimide layer 19. Thus, the polyimide layer 19 has a uniform thickness. The polyimide layer 19 allows the piezoelectric substrate 18 and the glass substrate 20 to maintain a substantially constant distance over the entire region where the piezoelectric substrate 18 and the glass substrate 20 oppose each other.

The polyimide layer 21 of the polyimide layer 19 has a hole $U_{21}$ in the region opposing the operational portion of the filter. The hole $U_{21}$ defines a recess 23 of the polyimide layer 19, formed in the region opposing the operational portion of the filter of the piezoelectric substrate 18. The presence of the recess 23 allows the bonded composite of the piezoelectric substrate 18 and the glass substrate 20 to have a space therewithin, and the operational portion of the filter is enclosed in the space of the recess 23.

In the second preferred embodiment, the internal side wall 23a of the recess 23 rises perpendicularly or substantially perpendicularly to the surface of the piezoelectric substrate 18. The internal bottom surface 23b of the recess 23 is a smooth flat plane opposing the surface of the piezoelectric substrate 18 with a constant distance.

Figure 3B:
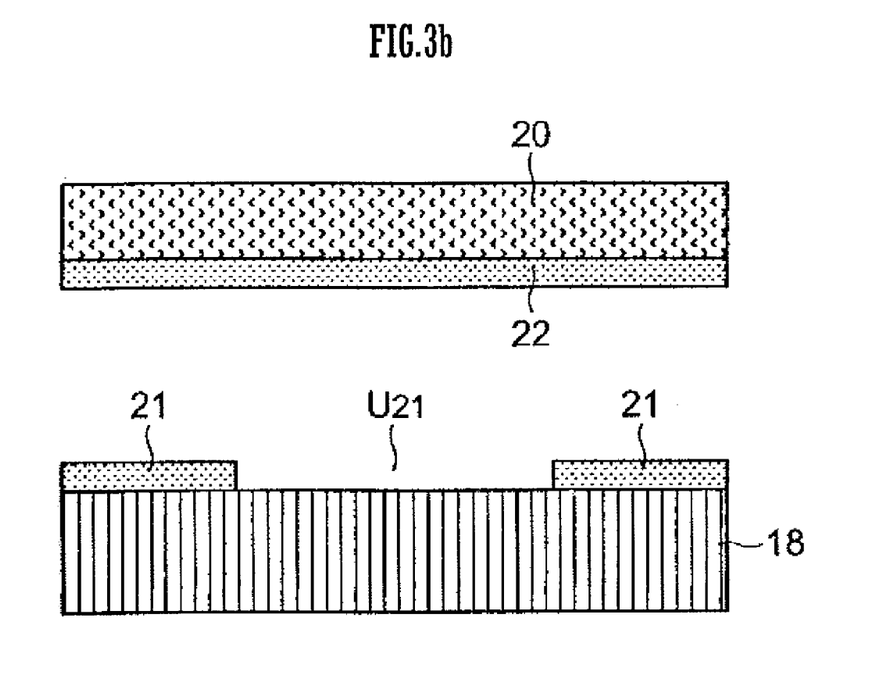
FIG. 3b is a representation of a manufacturing process of the SAW filter having an element structure according to the second preferred embodiment of the present invention.

In a manufacturing process of the SAW filter 17 of the second preferred embodiment, a polyimide resin is applied over the entire surface of the glass substrate 20, as shown in, for example, FIG. 3b. This application is performed so as to form a uniform thickness over the entire surface of the substrate by, for example, spin coating. Then, the applied polyimide resin is heated to form a semi-cured polyimide layer. The semi-cured polyimide layer is cured by the same step as the steps of curing the polyimide layers describe in the first preferred embodiment. Thus, a cured polyimide layer 22 is formed on the glass substrate 20.

In another step, a wiring pattern and the operational portion of the filter are patterned on the surface of the piezoelectric substrate 18. Then, a polyimide resin is applied to a uniform thickness over the entire surface of the piezoelectric substrate 18. Then, the polyimide resin is heated to form a semi-cured polyimide layer. A hole $U_{21}$ is formed in the region of this polyimide layer opposing the operational portion of the filter by photolithography. The polyimide layer on the piezoelectric substrate 18 is cured in the same manner as above. The heating temperature for curing the polyimide layer is such that the wiring pattern and the operational portion of the filter on the piezoelectric substrate 18 are not thermally damaged. Thus, a cured polyimide layer 21 is formed on the surface of the piezoelectric substrate 18.

Subsequently, the piezoelectric substrate 18 and the glass substrate 20 are opposed to each other such that the polyimide layers 21 and 22 come into contact with each other and are joined together by thermocompression bonding. Thus, the piezoelectric substrate 18 and the glass substrate 20 are combined together.

Thus, the SAW filter 17 of the second preferred embodiment is completed.

The present invention is not limited to the form of the first or second preferred embodiments, and various modifications may be made. For example, the polyimide layers 8A, 8B, and 22 formed on the glass substrates 7A, 7B, and 20 do not have recesses or holes in the first and second preferred embodiments. However, the polyimide layer 8A, 8B, or 22 may have a recess or a hole if necessary. In this instance, a polyimide resin is applied onto the glass substrates 7A, 7B, or 20 and is heated to form a semi-cured polyimide layer in the manufacturing process. The semi-cured polyimide layer is provided with a recess or a hole, and then the polyimide layer is cured. The cured polyimide layer 8A, 8B, or 22 is formed on the glass substrate 7A, 7B, or 20.

Exemplary forms of the present invention have been described using an acceleration sensor in the first preferred embodiment and an SAW filter in the second preferred embodiment. However, the present invention is not limited to the element structures of the acceleration sensor and the SAW filter, and can be applied to any element structure in which a substrate and another substrate are joined together with a polyimide layer therebetween, having a recess or a hole defining a space therewithin.

Figure 4:
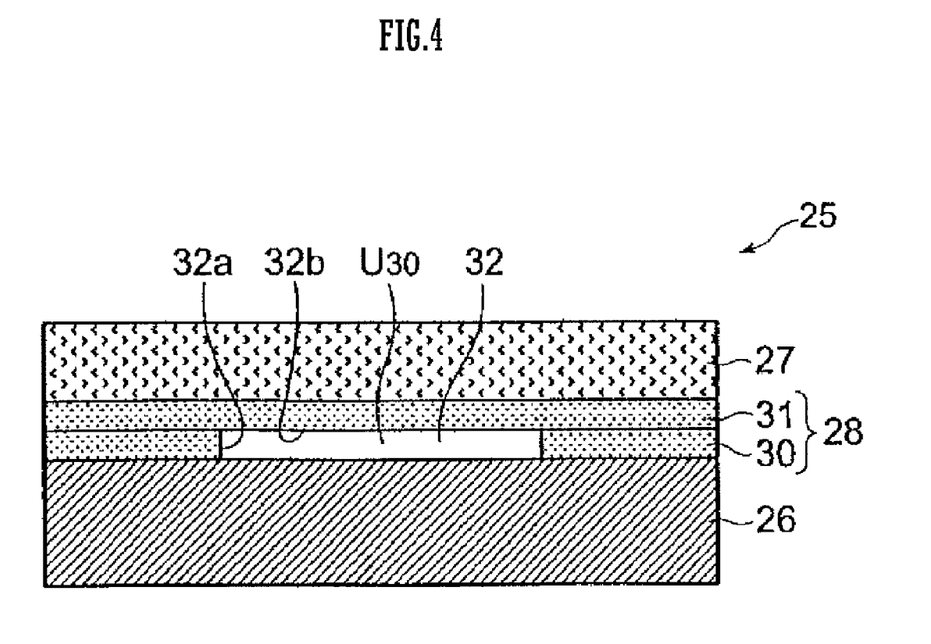
FIG. 4 is a representation of another preferred embodiment of the present invention.

For example, the present invention may be applied to a high frequency circuit element having a structure as shown in the schematic sectional view in FIG. 4. The high frequency circuit element 25 includes a compound semiconductor substrate (operational portion substrate (first substrate)) 26 having a high frequency circuit (not shown) as an operational portion in a region other than the outer region of the substrate, and a glass substrate (cover substrate (second substrate)) 27. These substrates are combined together with a polyimide layer 28 therebetween. The polyimide layer 28 is formed by joining a cured polyimide layer formed to a uniform thickness on the compound semiconductor substrate 26 (operational portion substrate side polyimide layer (first polyimide layer)) 30 and a cured polyimide layer formed to a uniform thickness on the glass substrate 27 (cover substrate side polyimide layer (second polyimide layer)) 31 together. The polyimide layer 28 has a uniform thickness throughout, and the polyimide layer 28 has a recess 32 defined by a hole $U_{30}$ formed in the polyimide layer 30. The bonded composite of the compound semiconductor substrate 26 and the glass substrate 27 thus has a space defined by the recess 32 therewithin.

In the high frequency circuit element 25 as well, the cured polyimide layers 30 and 31 are joined together by thermocompression bonding to form the polyimide layer 28. Consequently, the internal side wall 32a of the recess 32 rises perpendicular to the surface of the compound semiconductor substrate 26. Also, the internal bottom surface 32b of the recess 32 is a smooth flat plane opposing the surface of the compound semiconductor substrate 26 with a constant distance. In addition, since the polyimide layer 28 has a substantially uniform thickness throughout, the distance between the compound semiconductor substrate 26 and the glass substrate 27 is substantially constant over the entire region where the compound semiconductor substrate 26 and the glass substrate 27 oppose each other. While a high frequency circuit is provided as an operational portion in the preferred embodiment shown in FIG. 4, the high frequency circuit may be replaced with other electrical circuits.

While a glass substrate is used as a cover substrate in the first and second preferred embodiments, the cover substrate may be made of a material other than glass, such as a semiconductor, and can be made of any other appropriate material. While an SOI substrate, a piezoelectric substrate, and a compound semiconductor substrate are preferably used as the operational portion substrate, the operational portion substrate may be any other substrate suitable for forming the operational portion. Furthermore, while the polyimide layers 11A, 11B, and 19 of the first and second preferred embodiments each have a single recess 12A, 12B, or 23, two or more recesses may be formed in the polyimide layer 11A, 11B, or 19 so that the element structure has a plurality of spaces therewithin.

By providing the unique structure and arrangements of preferred embodiments of the present invention, the resulting elements have high reliabilities and durabilities and improved performance. Accordingly, the present invention can be applied to acceleration sensors, SAW filters, and high frequency circuit elements.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An element structure comprising:
    an operational portion substrate having an operational portion in a region other than an outer region of the substrate;
    a polyimide layer disposed on a front surface of the operational portion substrate, the polyimide layer having a recess in a region opposing the operational portion, the recess defining a space between the operational portion and the polyimide layer;
    a cover substrate combined with the operational portion substrate with the polyimide layer therebetween,
        wherein the recess has an internal side wall rising perpendicularly or substantially perpendicularly to the front surface of the operational portion substrate and a smooth flat internal bottom surface opposing the front surface of the operational portion substrate with a constant distance therebetween, and
    wherein the polyimide layer includes an operational portion substrate side surface, the polyimide layer having a uniform thickness disposed in a cured state on the surface of a portion of the operational portion substrate surrounding the operational portion; and
    a cover substrate side polyimide layer having a uniform thickness disposed in a cured state over the entirety of the operational portion substrate side surface of the polyimide layer, and the operational portion substrate side surface of the polyimide layer and the cover substrate side polyimide layer are joined together.

2. The element structure according to claim 1, wherein the cured polyimide layer and the cured cover substrate side polyimide layer are joined together by being pressed on each other and being heated to a bonding temperature.

3. The element structure according to claim 1, wherein the operational portion is a portion arranged to oscillate or move, an electrical circuit, or a high frequency circuit.

4. An element structure comprising:
    an operational portion substrate having an operational portion in a region other than an outer region of the substrate;
    a polyimide layer disposed on a front surface of the operational portion substrate, the polyimide layer having a recess in a region opposing the operational portion, the recess defining a space between the operational portion and the polyimide layer;
    a cover substrate combined with the operational portion substrate with the polyimide layer therebetween, wherein the recess has an internal side wall rising perpendicularly or substantially perpendicularly to the front surface of the operational portion substrate and a smooth flat internal bottom surface opposing the front surface of the operational portion substrate with a constant distance therebetween; and
    a second polyimide layer disposed on a rear surface of the operational portion substrate and having a second recess in a region opposing the operational portion of the operational portion substrate, the recess defining a space between the operational portion and the second polyimide layer on the rear surface; and a second cover substrate joined with the operational portion substrate with the second polyimide layer on the rear surface of the operational portion substrate therebetween, wherein the second recess of the second polyimide layer on the rear surface has an internal side wall rising perpendicular or substantially perpendicular to the rear surface of the operational portion substrate and an internal smooth flat bottom surface opposing the rear surface of the operational portion substrate with a constant distance therebetween.

* * * * *